US008361880B2

(12) United States Patent
Jiang et al.

(10) Patent No.: US 8,361,880 B2
(45) Date of Patent: Jan. 29, 2013

(54) SEMICONDUCTOR LIGHT-EMITTING DEVICE WITH METAL SUPPORT SUBSTRATE

(75) Inventors: Fengyi Jiang, Nanchang (CN); Chuanbing Xiong, Jiang Xi (CN); Wenqing Fang, Jiang Xi (CN); Li Wang, Jiang Xi (CN)

(73) Assignee: Lattice Power (JIANGXI) Corporation, Nanchang (CN)

( * ) Notice: Subject to any disclaimer, the term of this patent is extended or adjusted under 35 U.S.C. 154(b) by 377 days.

(21) Appl. No.: 12/063,989

(22) PCT Filed: Oct. 26, 2006

(86) PCT No.: PCT/CN2006/002871
§ 371 (c)(1),
(2), (4) Date: Feb. 15, 2008

(87) PCT Pub. No.: WO2007/048346
PCT Pub. Date: May 3, 2007

(65) Prior Publication Data
US 2008/0224154 A1    Sep. 18, 2008

(30) Foreign Application Priority Data

Oct. 27, 2005    (CN) .......................... 2005 1 0030868

(51) Int. Cl.
*H01L 21/30* (2006.01)
(52) U.S. Cl. ............................... 438/455; 257/E21.069
(58) Field of Classification Search .......... 458/455–459; 438/455–459, 976; 257/88, E21.09–E21.094
See application file for complete search history.

(56) References Cited

U.S. PATENT DOCUMENTS

| 5,164,245 | A  | * | 11/1992 | Suzuki ........................... 428/201 |
| 5,985,687 | A  | * | 11/1999 | Bowers et al. .................. 438/46 |
| 6,632,694 | B2 | * | 10/2003 | Torvik ............................ 438/22 |
| 6,946,312 | B2 | * | 9/2005 | Kon et al. ....................... 438/33 |
| 7,122,446 | B2 | * | 10/2006 | Nitta et al. ..................... 438/458 |
| 7,432,119 | B2 | * | 10/2008 | Doan .............................. 438/33 |
| 7,462,867 | B2 | * | 12/2008 | Tezen ............................. 257/79 |
| 7,537,949 | B2 | * | 5/2009 | Letertre et al. ................. 438/34 |
| 7,538,010 | B2 | * | 5/2009 | Faure et al. .................... 438/459 |
| 2002/0053681 | A1 | * | 5/2002 | Sugawara et al. ............. 257/103 |
| 2002/0123210 | A1 | * | 9/2002 | Liu ................................ 438/459 |
| 2003/0193055 | A1 | * | 10/2003 | Martter et al. ................. 257/79 |
| 2004/0048448 | A1 | * | 3/2004 | Koike et al. ................... 438/459 |
| 2004/0062282 | A1 | * | 4/2004 | Matsuoka et al. ............. 372/26 |

(Continued)

OTHER PUBLICATIONS

ASM Hand Book (Heat treating of Stainless steel, Austenitic Stainless Steels, Table 1, vol. 4, online edition 2010).*

(Continued)

*Primary Examiner* — Matthew W Such
*Assistant Examiner* — Ali Naraghi
(74) *Attorney, Agent, or Firm* — Shun Yao; Park, Vaughan, Fleming & Dowler LLP

(57) ABSTRACT

One embodiment of the present invention provides a semiconductor light-emitting device which includes a multi-layer structure. The multilayer structure comprises a first doped layer, an active layer, and a second doped layer. The semiconductor light-emitting device further includes a first Ohmic-contact layer configured to form a conductive path to the first doped layer, a second Ohmic-contact layer configured to form a conductive path to the second doped layer, and a support substrate comprising not less than 15% chromium (Cr) measured in weight percentage.

11 Claims, 2 Drawing Sheets

U.S. PATENT DOCUMENTS

| | | | |
|---|---|---|---|
| 2004/0077114 A1* | 4/2004 | Coman et al. | 438/46 |
| 2004/0183088 A1* | 9/2004 | DenBaars et al. | 257/102 |
| 2004/0206967 A1* | 10/2004 | Oshima et al. | 257/85 |
| 2005/0082556 A1* | 4/2005 | Sung et al. | 257/96 |
| 2005/0269943 A1* | 12/2005 | Hack et al. | 313/504 |
| 2006/0099730 A1* | 5/2006 | Lee et al. | 438/46 |
| 2006/0154389 A1* | 7/2006 | Doan | 438/21 |
| 2007/0020884 A1* | 1/2007 | Wang et al. | 438/455 |

OTHER PUBLICATIONS

ASM Hand Book (Heat treating of Stainless steel, Austentic Stainless Steels, Table 1, vol. 4, online edition 2010).*

* cited by examiner

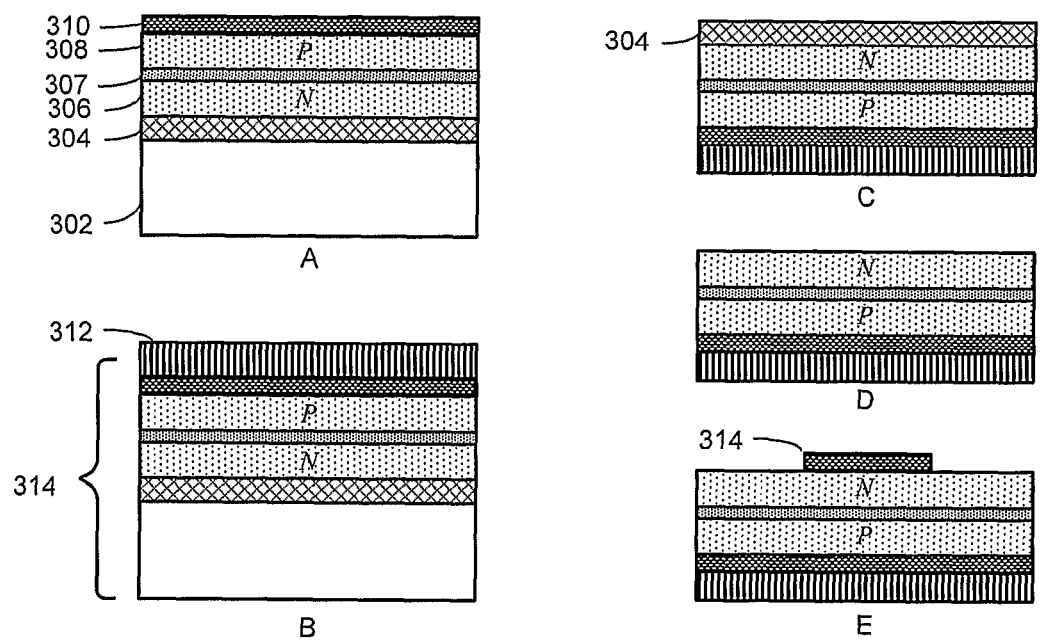
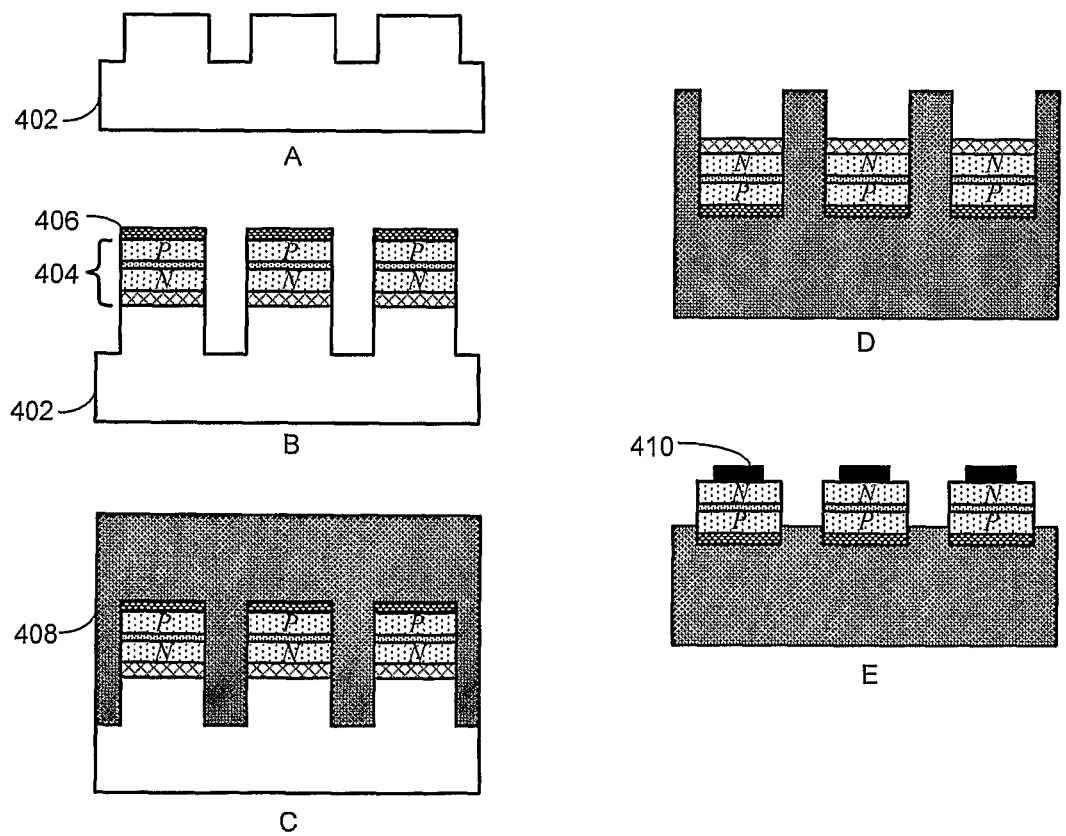
FIG. 3
FIG. 4

SEMICONDUCTOR LIGHT-EMITTING DEVICE WITH METAL SUPPORT SUBSTRATE

BACKGROUND

1. Field of the Invention

The present invention relates to the design of semiconductor light-emitting devices. More specifically, the present invention relates to novel semiconductor light-emitting device structures with a metal support substrate.

2. Related Art

Solid-state lighting is expected to be the illumination wave of the future. High-brightness light-emitting diodes (HB-LEDs) are emerging in an increasing number of applications, from light source for display devices to light-bulb replacement for conventional lighting. Typically, cost, efficiency, and brightness are the three foremost metrics for determining the commercial viability of LEDs.

An LED produces light from an active region which is "sandwiched" between a positively-doped layer (p-type doped layer) and negatively-doped layer (n-type doped layer). When the LED is forward-biased, the carriers, which include holes from the p-type doped layer and electrons from the n-type doped layer, recombine in the active region. In direct band-gap materials, this recombination process releases energy in the form of photons, or light, whose wavelength corresponds to the energy band-gap of the material in the active region.

In recent years, an increasing demand has emerged for blue LED's. Blue LEDs are generally based on wide band-gap semiconductor materials, including nitride materials such as GaN. Successful epitaxial growth of nitride materials requires matching of the lattice constant and thermal-expansion coefficients of the substrate and epitaxial layers. Consequently, unconventional substrate materials, such as sapphire ($Al_2O_3$) and silicon carbide (SiC), are often necessary to achieve such matching. Since sapphire has low conductivity, an LED fabricated on such substrates often requires the electrodes to be on the same side of the substrate. However, this lateral-electrode configuration can reduce light-emitting efficiency, increase fabrication complexity, and limit heat dissipation during operation.

To overcome these limitations, researchers have been experimenting wafer-bonding techniques to construct vertical-electrode LEDs. During wafer bonding, a second support wafer is bonded to the top of the LED device structure, and the initial growth substrate on which the device is epitaxially formed is removed. The entire device is then "flipped" upside-down. The new support substrate can have high conductivity, and therefore can facilitate vertical electrode configurations.

However, wafer bonding often needs expensive bonding materials, such as gold, and can introduce mechanical defects in the bonding process which can lower device reliability and decrease production yield. Hence, what is needed is a device structure which facilitates vertical electrode configuration, is less costly and more reliable, and which can provide superior mechanical characteristics.

SUMMARY

One embodiment of the present invention provides a semiconductor light-emitting device which includes a multilayer structure. The multilayer structure comprises a first doped layer, an active layer, and a second doped layer. The semiconductor light-emitting device further includes a first Ohmic-contact layer configured to form a conductive path to the first doped layer, a second Ohmic-contact layer configured to form a conductive path to the second doped layer, and a support substrate comprising not less than 15% chromium (Cr) measured in weight percentage.

In a variation of this embodiment, the support substrate is a Cr layer or a Cr-alloy layer.

In a further variation, the support substrate further comprises iron (Fe).

In a variation of this embodiment, the thickness of the support substrate is not less than 10 microns and not more than 200 microns.

In a further variation, the thickness of the support substrate is not less than 20 microns and not more than 150 microns.

In a variation of this embodiment, the semiconductor light-emitting device further includes a bonding-material layer between the support substrate and the first Ohmic-contact layer.

In a variation of this embodiment, the support substrate is fabricated by at least one of: physical vapor deposition, chemical vapor deposition, and electroplating.

In a variation of this embodiment, the support substrate is fabricated by at least one of: arc ion deposition, sputtering, and electron-beam evaporation.

In a further variation, the support substrate is fabricated by an arc ion deposition process, the source materials of which include chromium and stainless steel.

In a variation of this embodiment, the first Ohmic-contact layer comprises platinum (Pt).

In a variation of this embodiment, the second Ohmic-contact layer comprises gold (Au), germanium (Ge), and nickel (Ni), or an alloy of Au/Ge/Ni.

In a variation of this embodiment, the multilayer semiconductor structure comprises $In_xGa_yAl_{1-x-y}N$ ($0 \leq x \leq 1$, $0 \leq y \leq 1$). The first doped layer is a p-type or n-type doped layer, and the second doped layer is an n-type or p-type doped layer, respectively. Further, the active layer includes an InGaN/GaN multi-quantum well structure.

One embodiment of the present invention provides a method for fabricating a semiconductor light-emitting device. The method comprises fabricating on a growth substrate a multilayer structure which comprises a first doped layer, an active layer, and a second doped layer. The method further comprises fabricating a first Ohmic-contact layer configured to form a conductive path to the first doped layer and fabricating a second Ohmic-contact layer configured to form a conductive path to the second doped layer. In addition, the method comprises fabricating a support substrate layer above the multilayer structure, the support substrate comprising not less than 15% Cr measured in weight percentage. The method also comprises removing the growth substrate.

In a variation of this embodiment, fabricating the support substrate involves fabricating a Cr layer or a Cr-alloy layer.

In a further variation, fabricating the Cr-alloy layer involves fabricating a Cr—Fe alloy layer.

In a variation of this embodiment, the thickness of the support substrate is not less than 10 microns and not more than 200 microns.

In a further variation, the thickness of the support substrate is not less than 20 microns and not more than 150 microns.

In a variation of this embodiment, the growth substrate comprises one of: silicon, sapphire, silicon carbide, gallium nitride (GaN), and gallium arsenide (GaAs).

In a variation of this embodiment, the method further comprises etching the growth substrate to produce mesas prior to fabricating the multilayer structure.

In a variation of this embodiment, fabricating the support substrate involves bonding the support substrate to the multilayer structure using a bonding-material layer prior to removing the growth substrate.

In a variation of this embodiment, fabricating the support substrate involves at least one of: physical vapor deposition, chemical vapor deposition, and electroplating.

In a variation of this embodiment, fabricating the support substrate involves at least one of: arc ion deposition, sputtering, and electron-beam evaporation.

In a further variation, fabricating the support substrate involves using arc ion deposition process the source materials of which include chromium and stainless steel.

In a variation of this embodiment, fabricating the first Ohmic-contact layer comprises fabricating a Pt layer.

In a variation of this embodiment, fabricating the second Ohmic-contact layer comprises fabricating a layer which comprises Au, Ge, and Ni, or an alloy of Au/Ge/Ni.

In a variation of this embodiment, the multilayer semiconductor structure comprises $In_xGa_yAl_{1-x-y}N$ ($0 \leq x \leq 1$, $0 \leq y \leq 1$). The first doped layer is a p-type or n-type doped layer, and the second doped layer is an n-type or p-type doped layer, respectively. The active layer includes an InGaN/GaN multi-quantum well structure.

One embodiment of the present invention provides a method for fabricating a semiconductor light emitting device. The method comprises etching a growth substrate to produce mesas; fabricating a buffer layer on the growth substrate; fabricating an n-type doped $In_xGa_yAl_{1-x-y}N$ ($0 \leq x \leq 1$, $0 \leq y \leq 1$) layer; fabricating a multi-quantum well active layer; fabricating a p-type doped $In_xGa_yAl_{1-x-y}N$ ($0 \leq x \leq 1$, $0 \leq y \leq 1$) layer; fabricating a p-side Ohmic-contact layer which forms a conductive path to the p-type doped $In_xGa_yAl_{1-x-y}N$ layer; fabricating a support substrate comprising not less than 15% chromium (Cr) measured in weight percentage; removing the growth substrate; removing substantially the buffer layer; and fabricating an n-side Ohmic-contact layer which forms a conductive path to the n-type doped $In_xGa_yAl_{1-x-y}N$ layer.

BRIEF DESCRIPTION OF THE FIGURES

FIG. 3 illustrates a process for fabricating an LED with vertical electrodes and a metal support substrate in accordance with one embodiment of the present invention.

FIG. 4 illustrates a process for fabricating an LED with vertical electrodes and a metal support substrate based on a pre-processed silicon substrate in accordance with one embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the present invention. Thus, the present invention is not limited to the embodiments shown, but is to be accorded the widest scope consistent with the claims.

LED with Vertical Electrodes

Generally, the two electrodes of an LED can be placed on the same side of the substrate (lateral electrodes) or on different sides of the substrate (vertical electrodes). Vertical-electrode configuration is a preferred design due to its ease of packaging and better reliability, and because of the limitations associated with lateral-electrode device structures and the inherent substrate characteristics, such as low electrical conductivity, low transparency, and low thermal conductivity.

Figure 1:
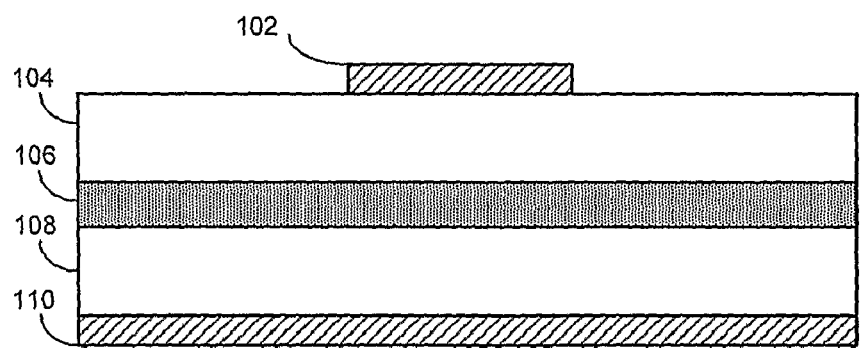
FIG. 1 illustrates an LED structure with vertical electrodes.

FIG. 1 illustrates a typical LED structure with vertical electrodes. An active layer 106 is "sandwiched" between an upper layer 104 and a lower layer 108. Note that upper layer 102 or lower layer 108 can include additional layers, such as an n-type or p-type doped cladding layer, a substrate layer, or a buffer layer. Further, a cladding layer can include one or more layers of material, although "cladding layer" as used in some literature refers only to a doped layer immediately adjacent to the active layer.

Above upper layer 104 is an upper electrode 102, which is a layer of conductive or low-resistance material that can form a conductive path to upper layer 104. Below lower layer 108 is a lower electrode 110, which is also a layer of conductive or low-resistance material. For instance, upper electrode 102 and lower electrode 110 can be both Ohmic-contact layers. Note that an Ohmic-contact layer can form an Ohmic contact with an adjacent layer, which typically exhibits a low resistance. An Ohmic-contact layer can be based on one or more metal, alloy, or compound materials, such as Pt, Ni, NiO, and ITO (indium tin oxide). Upper layer 104 can include an n-type doped layer, and lower layer 108 can include a p-type doped layer.

The recent development in $In_xGa_yAl_{1-x-y}N$ ($0 \leq x \leq 1$, $0 \leq y \leq 1$) materials has extended the LED light-emission spectrum to the green, blue, and ultra-violet regions. Furthermore, InGaAlN-based LEDs can achieve high brightness unavailable in previous generations of LEDs. Currently, InGaAlN LEDs are usually fabricated on sapphire or SiC substrates. Sapphire substrate has low electrical and thermal conductivity, and can be difficult to dice due to its hardness. SiC substrate is electrically conductive and has high thermal conductivity. However, the associated high costs make SiC substrates unsuitable for large-volume commercial production.

The latest research efforts have been focusing on using silicon substrates to manufacture nitride LEDs. As a substrate material, silicon has both good electrical and thermal conductivity. Furthermore, the costs of silicon substrates are significantly lower than the costs of sapphire or SiC substrates. However, silicon is not transparent to visible light. Hence, a simple vertical-electrode device structure based on the original silicon substrate can result in low light-emission efficiency due to the absorption by silicon.

To mitigate the aforementioned problems associated with silicon or sapphire substrates, one can use wafer bonding to transfer the multilayer structure from the original growth substrate to a different support substrate. In the case of silicon substrate, a reflective layer between the device and the support substrate can reduce light absorption. For sapphire substrates, wafer-bonding techniques can also mitigate problems associated with the low electrical and thermal conductivities.

Note that for the following description, "nitride material" and "GaN material" generally includes to $In_xGa_yAl_{1-x-y}N$ ($0 \leq x \leq 1$, $0 \leq y \leq 1$), which can be a binary, ternary, or quaternary compound, such as GaN, InGaN, GaAlN, and InGaAlN.

Figure 2:
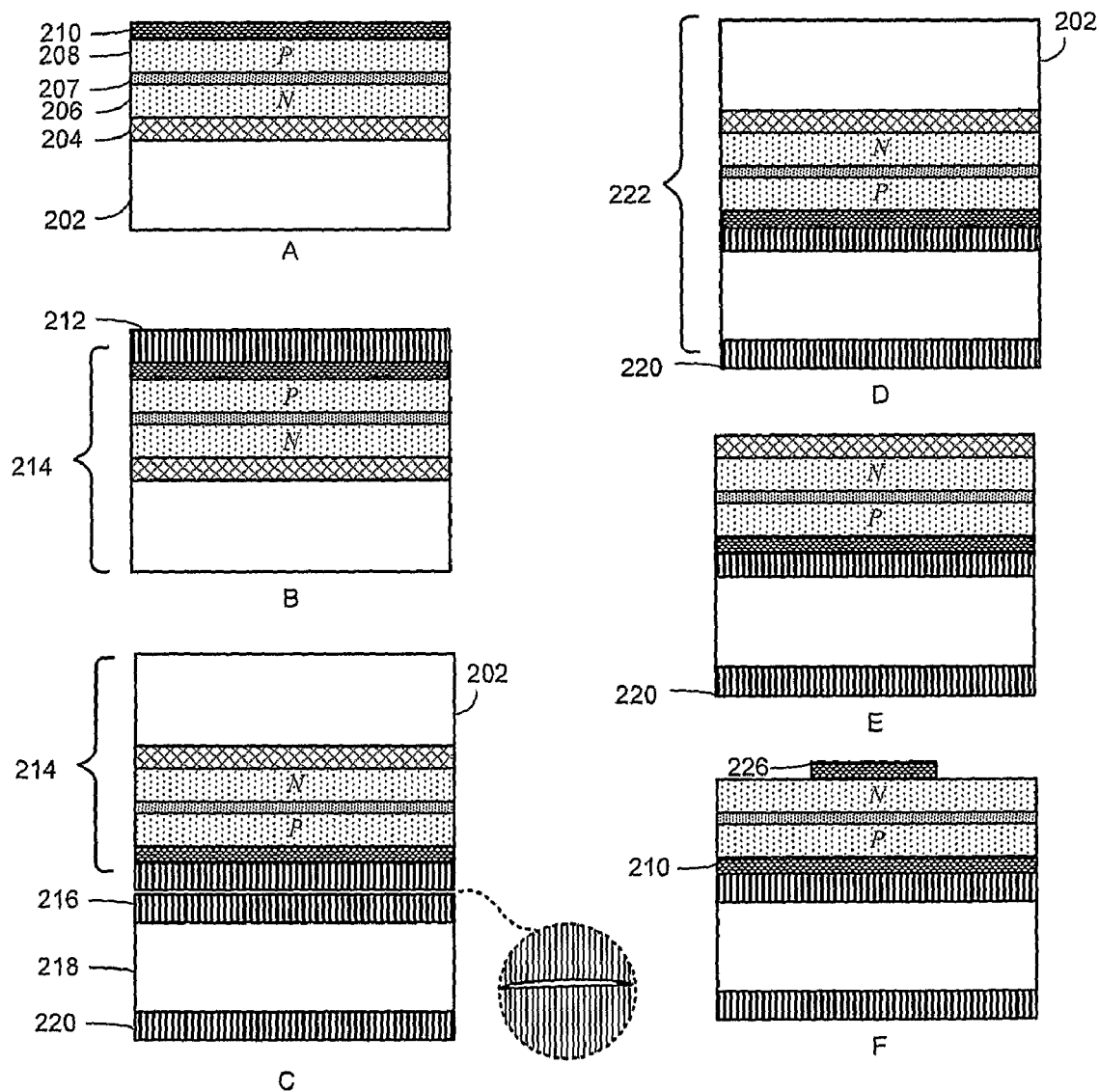
FIG. 2 illustrates a process for fabricating an LED with vertical electrodes using wafer bonding.

FIG. 2 illustrates a process for fabricating an LED with vertical electrodes using wafer bonding. In Step A, based on a generally known InGaAlN-device fabrication process, a GaN light-emitting multilayer structure is first fabricated on a growth substrate 202. Optionally, a buffer layer 204 is grown on substrate 202 for lattice-constant and/or thermal-expansion coefficient matching purposes. An n-type doped layer 206 is then grown on buffer layer 204. An InGaN/GaN multi-quantum-well active layer 207 and a p-type doped layer 208 are formed on n-type doped layer 206.

Subsequently, an Ohmic-contact layer 210 is formed on p-type doped layer 208. Formation of Ohmic-contact layer 210 can use any chemical or physical vapor deposition method, such as electron-beam evaporation, filament evaporation, or sputter deposition. Ohmic-contact layer 210 can also be a reflective material with a reflectivity not less than 30%.

In Step B, a bonding metal material 212 is deposited over Ohmic-contact layer 210. Gold is a candidate material because of its extensibility, relatively low eutectic temperature, and low resistivity.

In Step C, the entire multilayer structure 214 is flipped upside-down, and the bonding material layer 212 is bonded under increased temperature and pressure with a corresponding bonding material layer 216 on one side of a support substrate 218. Note that support substrate 218 can have a second gold layer 220 covering the other side, so that support substrate 218 can withstand the subsequent removal of growth substrate 202 if wet etching is used.

Note that a successful wafer bonding that is strong and consistant across the entire wafer area requires a high flatness of both surfaces. The bonding occurs under high temperature and high pressure. Any surface defect can impair the bonding quality and leave gaps between the two bonding layers, as is shown in the enlarged view in Step C.

In Step D, a bonded structure 222 is formed, which includes both growth and support substrates with the LED structure "sandwiched" between.

In Step E, the original growth substrate 202 is removed. Laser lift-off is commonly used for removing a sapphire substrate. Wet etching based on KOH or HNA can be used to remove a silicon substrate. Note that the physical defects in the bonding layers, such as gaps between uneven surfaces, can impair device quality during wet etching.

In Step F, buffer layer 204 is removed and a second Ohmic-contact layer 226 is deposited, patterned, and etched over the n-type doped layer. Hence, Ohmic-contact layers 226 and 210 form a pair of vertical electrodes.

Although wafer bonding is a viable approach to fabricate vertical-electrode LEDs, the bonding material such as gold is often expensive. Furthermore, the physical defects introduced during the bonding process may lower the device reliability and/or production yield, which are critical for high-volume LED production.

Metal Support Substrate

Embodiments of the present invention facilitate a novel LED structure which includes a metal support substrate that does not require wafer bonding. The LED multilayer structure can be transferred from a growth substrate to a support substrate at lower cost while maintaining high device reliability and product yield. Furthermore, the metal support substrate improves heat dissipation, helps lower the LED's operation temperature, and facilitates easier device dicing.

In one embodiment, after the LED multilayer structure is fabricated on a growth substrate, a layer of metal is directly deposited above the Ohmic-contact layer. This metal layer is sufficiently thick to provide the mechanical strength to support the device structure. As a result, a separate wafer-bonding process is not necessary. According to one embodiment, an LED device includes a metal support substrate, a first Ohmic-contact layer, a semiconductor multilayer structure, and a second Ohmic-contact layer.

The semiconductor multilayer structure can be based on different materials, such as $In_xGa_yAl_{1-x-y}N$ ($0 \leq x \leq 1$, $0 \leq y \leq 1$), $In_xGa_yAl_{1-x-y}P$ ($0 \leq x \leq 1$, $0 \leq y \leq 1$), $In_xGa_yAl_{1-x-y}As$ ($0 \leq x \leq 1$, $0 \leq y \leq 1$), and $Mg_xZn_yCd_{1-x-y}O$ ($0 \leq x \leq 1$, $0 \leq y \leq 1$). In a preferred embodiment, the semiconductor multilayer device is based on $In_xGa_yAl_{1-x-y}N$ ($0 \leq x \leq 1$, $0 \leq y \leq 1$). The multilayer structure can contain, from bottom up, a p-type doped layer, an active layer, and an n-type doped layer. Alternatively, the multilayer structure can contain, from bottom up, an n-type doped layer, an active layer, and a p-type doped layer.

FIG. 3 illustrates a process for fabricating an LED with vertical electrodes and a metal support substrate in accordance with one embodiment of the present invention. In Step A, a semiconductor multilayer structure is fabricated on a growth substrate 302. The multilayer structure includes a buffer layer 304, an n-type doped layer 306, an active layer 307, a p-type doped layer 308, and an Ohmic-contact layer 310. Growth substrate can be based on silicon, sapphire, GaAs, or other available materials. In one embodiment, the growth substrate is silicon- or GaAs-based, since these materials can be easily removed using wet etching.

In a further embodiment, growth substrate 302 is a silicon substrate, and buffer layer 304, n-type doped GaN layer 306, InGaN/GaN multi-quantum-well layer 307, and p-type doped GaN layer 308 are deposited on growth substrate 302 using chemical vapor deposition (CVD). Subsequently, the entire structure is subject to an annealing temperature at substantially 720° C. to activate the p-type dopant. Furthermore, a Pt Ohmic-contact layer 310 is formed above the p-type doped layer 308.

In Step B, a metal layer 312 is deposited above Ohmic-contact layer 310 to function as a support substrate for multilayer structure 314. Metal layer 312 can be based on any metal or conductive materials. Preferably, metal layer 312 contains a metal which is resistant to corrosion, such as chromium. In one embodiment, metal layer 312 contains chromium (Cr) or a chromium alloy, and can further contain gold (Au), platinum (Pt), copper (Cu), or iron (Fe). In one embodiment, metal layer 312 contains not less than 15% chromium measured in weight percentage. Chromium is a preferred material of metal layer 312 because of its corrosion resistance, low cost, high electrical and thermal conductivity, and high reflectivity. Additionally, chromium's thermal expansion coefficient is close to that of GaN, and chromium's hardness can further facilitate device dicing.

Ideally, metal layer 312 is sufficiently thick to provide mechanical support to the multilayer structure during the subsequent processing steps and device dicing. In one embodiment, metal layer 312's thickness is not less than 10 microns and not greater than 200 microns. In a further embodiment, metal layer 312's thickness is not less than 20 microns and not greater than 150 microns.

Metal layer 312 can be deposited using any plating, physical vapor deposition (PVD), or chemical vapor deposition (CVD) methods, including electroplating, arc ion deposition, electron beam evaporation, sputtering, metal organic CVD (MOCVD), plasma enhanced CVD (PECVD), atomic layer deposition (ALD), molecular beam epitaxy (MBE). Other deposition methods are also possible.

Preferably, the chosen deposition method can deposit metal layer 312 at a relatively high speed, thereby improving production efficiency and preventing formation of an overly dense metal layer that is. An overly dense metal layer may result in significant thermal mismatch with the GaN layers in the multilayer structure. If the device is subject to high temperature variations in subsequent processing or during operation, this thermal-expansion mismatch may cause physical cracking of the device.

In one embodiment, metal layer 312 is deposited using arc ion deposition. Traditionally, arc ion deposition is used to form hard coatings on surfaces of cutting tools and moulds to increase their hardness and wear resistance. Here, arc ion deposition can be used to deposit quickly a chromium layer above the device wafer. Furthermore, the metal film deposited by arc ion deposition is generally not as dense as that deposited by other slower deposition methods. Consequently, the resulting support substrate is more forgiving to the thermal-expansion mismatch between the semiconductor layers and the metal layer.

Electroplating can also be used to deposit the metal support substrate. However, if the growth substrate is not a good conductive material, electroplating can be difficult to perform. For example, if the growth substrate is high-resistance silicon, arc ion deposition of chromium or chromium alloy is a more effective deposition method. In one embodiment, metal layer 312 is deposited using an arc ion deposition process that includes both chromium and stainless steel as source materials.

In Step C, growth substrate 302 is removed. In one embodiment where growth substrate 302 is a silicon substrate, wet etching is used. Other removal methods, such as laser lift-off, can also be used.

In Step D, buffer layer 304 is entirely or partially removed using, for example, reactive ion etching (RIE), to expose the n-type doped layer 306.

In Step E, another Ohmic-contact layer 314 is further deposited on n-type doped layer 306.

Note that instead of direct deposition, one can also use bonding to attach the metal support substrate to the device. In this case, an additional layer of bonding material is present between metal layer 312 and Ohmic-contact layer 310 to increase the adhesion between these two layers.

In a further embodiment, one can pre-process the silicon growth substrate to form mesas before fabricating the LED multilayer structure. Such mesas increase the substrate's tolerance of the stress caused by the thermal-expansion mismatch between the GaN material and substrate material. FIG. 4 illustrates a process for fabricating an LED with vertical electrodes and a metal support substrate based on a pre-processed silicon substrate in accordance with one embodiment of the present invention.

In Step A, a silicon growth substrate is patterned and etched to produce a number of mesas. Each mesa defines the area for a GaN-material multilayer structure.

In Step B, multilayer structures 404 are formed above the substrate mesas. In addition, an Ohmic-contact layer 406 is deposited above the p-type doped layer of each individual structure. Note that in one embodiment, the mesas are sufficiently apart so that the epitaxial growth of different layers does not create any attachment between two individual structures.

In Step C, a chromium support-substrate layer 408 is deposited above the multilayer structures. Chromium layer 408 is sufficiently thick and fills the gaps between the mesas.

In Step D, silicon growth substrate 402 is removed using wet etching. Chromium support substrate 402 supports each multilayer structure. Note that in the resulting structure, chromium fills the gaps between the individual multilayer structures.

In Step E, chromium support substrate 408 is further etched below the active layer of the multilayer structures to prevent leakage current. In addition, a second Ohmic-contact layer 410 is deposited above the multilayer structure.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for fabricating a semiconductor light-emitting device, the method comprising:
    etching a Si growth substrate to produce mesas;
    fabricating on a multilayer structure on at least one of the mesas, wherein the multiplayer structure comprises a first doped layer, an active layer, and a second doped layer;
    fabricating a first Ohmic-contact layer configured to form a conductive path to the first doped layer;
    fabricating a second Ohmic-contact layer configured to form a conductive path to the second doped layer;
    fabricating a support substrate layer above the multilayer structure, wherein the support substrate comprises not less than 15% Cr measured in weight percentage and iron, wherein the support substrate has a thickness that is between 10 microns and 200 microns, and wherein the support substrate is in direct contact with the first Ohmic-contact layer, thereby enabling the semiconductor light-emitting device to have vertical electrodes; and
    removing the Si growth substrate that comprises mesas.

2. The method of claim 1, wherein fabricating the support substrate involves fabricating a Cr layer or a Cr-alloy layer.

3. The method of claim 1, wherein fabricating the Cr-alloy layer involves fabricating a Cr—Fe alloy layer.

4. The method of claim 1, wherein the thickness of the support substrate is not less than 20 microns and not more than 150 microns.

5. The method of claim 1, wherein fabricating the first Ohmic-contact layer comprises fabricating a Pt layer.

6. The method of claim 1, wherein fabricating the second Ohmic-contact layer comprises fabricating a layer which comprises Au, Ge, and Ni, or an alloy of Au/Ge/Ni.

7. The method of claim 1
    wherein the multilayer semiconductor structure comprises $In_xGa_yAl_{1-x-y}N$ ($0 \leq x \leq 1$, $0 \leq y \leq 1$);
    wherein the first doped layer is a p-type or n-type doped layer, and the second doped layer is an n-type or p-type doped layer, respectively; and
    wherein the active layer includes an InGaN/GaN multi-quantum well structure.

8. The method of claim 1, wherein fabricating the support substrate involves bonding the support substrate to the multilayer structure using a bonding-material layer prior to removing the growth substrate.

9. The method of claim 1, wherein fabricating the support substrate involves at least one of:
    physical vapor deposition, chemical vapor deposition, and electroplating.

10. The method of claim 1, wherein fabricating the support substrate involves at least one of:
    arc ion deposition, sputtering, and electron-bean evaporation.

11. The method of claim 10, wherein the source materials of the arc ion deposition process include chromium and stainless steel.

* * * * *